United States Patent [19]

Matsuda

[11] Patent Number: 4,561,065
[45] Date of Patent: Dec. 24, 1985

[54] ARITHMETIC PROCESSING DEVICE USING SAMPLED INPUT DATA AND SEVERAL PREVIOUS OUTPUT DATA

[75] Inventor: Susumu Matsuda, Tokyo, Japan

[73] Assignee: Tokyo Shibaura Denki Kabushiki Kaisha, Kawasaki, Japan

[21] Appl. No.: 467,347

[22] Filed: Feb. 17, 1983

[30] Foreign Application Priority Data

Feb. 23, 1982 [JP] Japan .................................. 57-27810
Jul. 28, 1982 [JP] Japan ................................ 57-131568

[51] Int. Cl.⁴ ............................................ G06F 15/31
[52] U.S. Cl. .................................................... 364/724
[58] Field of Search ............................... 364/724, 736

[56] References Cited

U.S. PATENT DOCUMENTS

| | | | |
|---|---|---|---|
| 3,200,379 | 8/1965 | King et al. | 364/200 |
| 4,125,900 | 11/1978 | Betts | 364/724 |
| 4,146,931 | 3/1979 | Delforge | 364/724 |
| 4,223,389 | 9/1980 | Amada et al. | 364/724 |
| 4,337,518 | 6/1982 | Ohnishi et al. | 364/724 |
| 4,450,533 | 5/1984 | Petit et al. | 364/724 |

FOREIGN PATENT DOCUMENTS 1519003  7/1978  United Kingdom .

OTHER PUBLICATIONS

Osborne, "Einfuhrung in die Mikro-Computer-Technik", published by te-wi Verlag GmbH Munich, 1977, Der Stapel speicher, pp. 6-32 and 6-33.

Primary Examiner—David H. Malzahn
Attorney, Agent, or Firm—Kenyon & Kenyon

[57] ABSTRACT

An arithmetic operating device has a register file for storing output data for a few previous sampling periods, a control store for accessing the register file, and an operation circuit for calculating output data using the data stored in the register file. An output from the control store is the same address signal for the same piece of data to be accessed. The output from the control store is converted by an address converter in accordance with the sampling period number and the converted address signal obtained is supplied to the register file.

6 Claims, 7 Drawing Figures

ARITHMETIC PROCESSING DEVICE USING SAMPLED INPUT DATA AND SEVERAL PREVIOUS OUTPUT DATA

BACKGROUND OF THE INVENTION

The present invention relates to an arithmetic processing device for obtaining output data during each sampling period, using the input data during the sampling period and the output data during a few preceding sampling periods of a digital filter or the like.

In general, an output Y(t) of a second-order recursive digital filter is given by:

$$Y(T) = X(T) - B1 \cdot Y(T-1) - B2 \cdot Y(T-2) \quad (1)$$

where X(T) is input data, B1 and B2 are coefficients, and T is the current sampling period number (=0, 1, ...).

FIG. 1 shows a block diagram of a conventional second-order recursive digital filter. Variables X(T), Y(T), Y(T−1) and Y(T−2) are stored in a register file 10, while coefficients +1, −B1 and −B2 are stored in a coefficient register 12 (e.g., a ROM). The address signals for accessing the register file 10 and the coefficient register 12 are provided by a control store 14. The control store 14 thus produces address signals in a predetermined order for each sampling period. Sample input data X(T) and sample output data Y(T) to be described later are supplied to the register file 10. Outputs from the register file 10 and the coefficient register 12 are supplied to a multiplier 16, and the multiplied product outputs therefrom are supplied to an accumulator 18 through an adder 17. The accumulator 18 is cleared by the control store 14. The output Y(T) from the accumulator 18 is provided as the output from the digital filter.

The digital filter of the configuration as described above operates in the manner to be described below for each sampling period. The input data X(T) is stored in address "00" of the register file 10. Before this time point, the immediately preceding output data Y(T−1) and the output data Y(T−2) which immediately precedes the data Y(T−1) have been respectively stored at addresses "10" and "11" of the register file 10. When the input data X(T) is stored, the current output data Y(T) may now be calculated. Note that the accumulator 18 is in the cleared state at this point. The control store 14 calculates according to the above-stated relation (1) based on the outputs from the register file 10 and the coefficient register 12 using the multiplier 16, an adder 17 and the accumulator 18. The output Y(T) from the accumulator 18 is stored in address "01" of the register file 10. Output data Y(T), Y(T−1) and Y(T−2) respectively become Y(T−1), Y(T−2) and Y(T−3) in the next sampling period. However, the control store 14 produces the same address signals for the same data. More specifically, the control store 14 always produces an address signal "10" for accessing the immediately preceding output data Y(T−1). For this reason, in the next sampling period, Y(T−2) is used where Y(T−1) would be used. In view of this, when the arithmetic operation is completed and the current output data Y(T) is stored in the register file 10, data are transferred within the register file 10. More specifically, the data Y(T) and Y(T−1) stored in addresses "01" and "10" of the register file 10 are respectively shifted to addresses "10" and "11". Then, in the next sampling period, the current and immediately preceding output data Y(T), Y(T−1) are respectively handled as the immediately preceding output data Y(T−1) and the output data Y(T−2) which immediately precedes the output data Y(T−1), thus solving the above problem.

In this manner, the conventional digital filter requires transfer of output data within the register file after each sampling period. This degrades the data processing speed. This problem becomes more pronounced as the order of the filter becomes higher. In general, a single arithmetic circuit comprises more than one digital filter. In order to fit more than one filter into a single arithmetic circuit, the processing time per digital filter must be reduced to the minimum.

SUMMARY OF THE INVENTION

It is an object of the present invention to improve the processing speed of an arithmetic processing device which calculates output data for each sampling period using sample input and/or output data of previous few sampling periods.

The above object is realized by an arithmetic processing device for calculating output data for each sampling period using sample data of previous few sampling periods, which comprises a register having N (where N is a positive integer) addresses for storing the sample data of previous few sampling periods, a control store for producing a first address signal CS of m bits (where $N < 2^m$) which is exclusively determined by data to be accessed, an address converter for generating a second address signal AD=(CS - T modulo N) modulo N in accordance with the first address signal CS and a current sampling period number T (=0, 1, ...), and an arithmetic circuit for calculating output data for each sampling period using the data in the register which are accessed by the second address signal.

DETAILED DESCRIPTION OF THE PREFERRED EMBODIEMTNS

Figure 1:
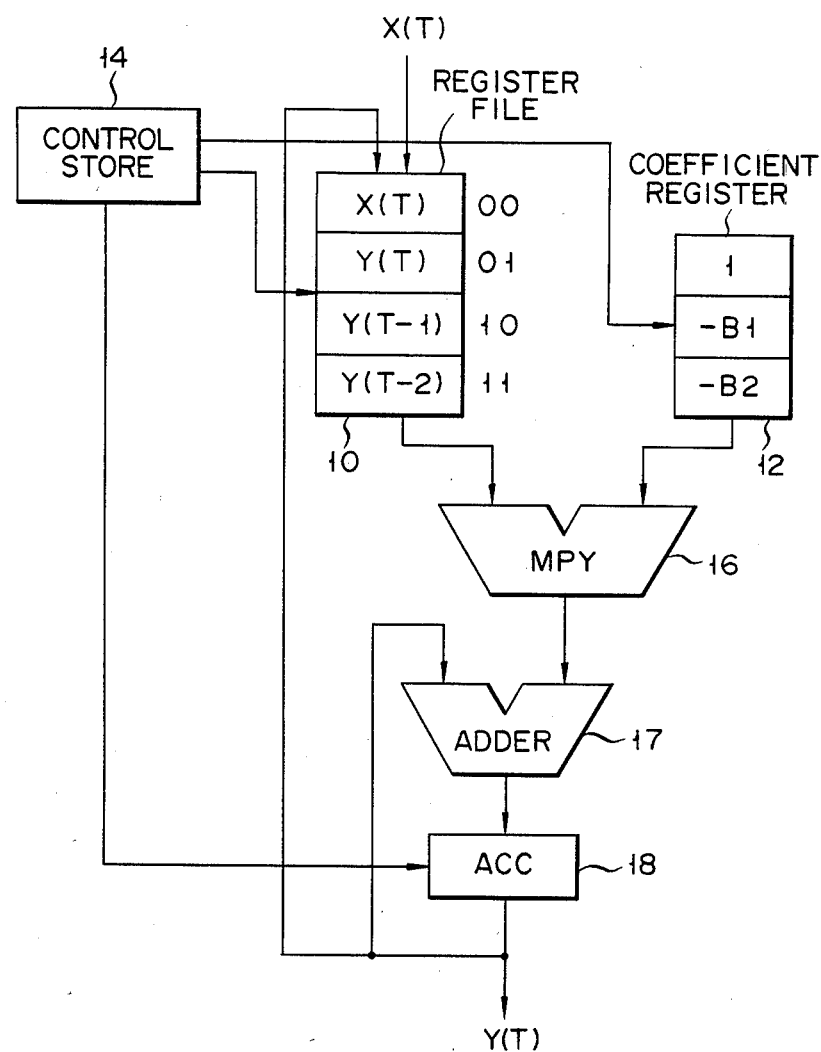
FIG. 1 is a block diagram of a conventional second-order recursive digital filter.
Figure 2:
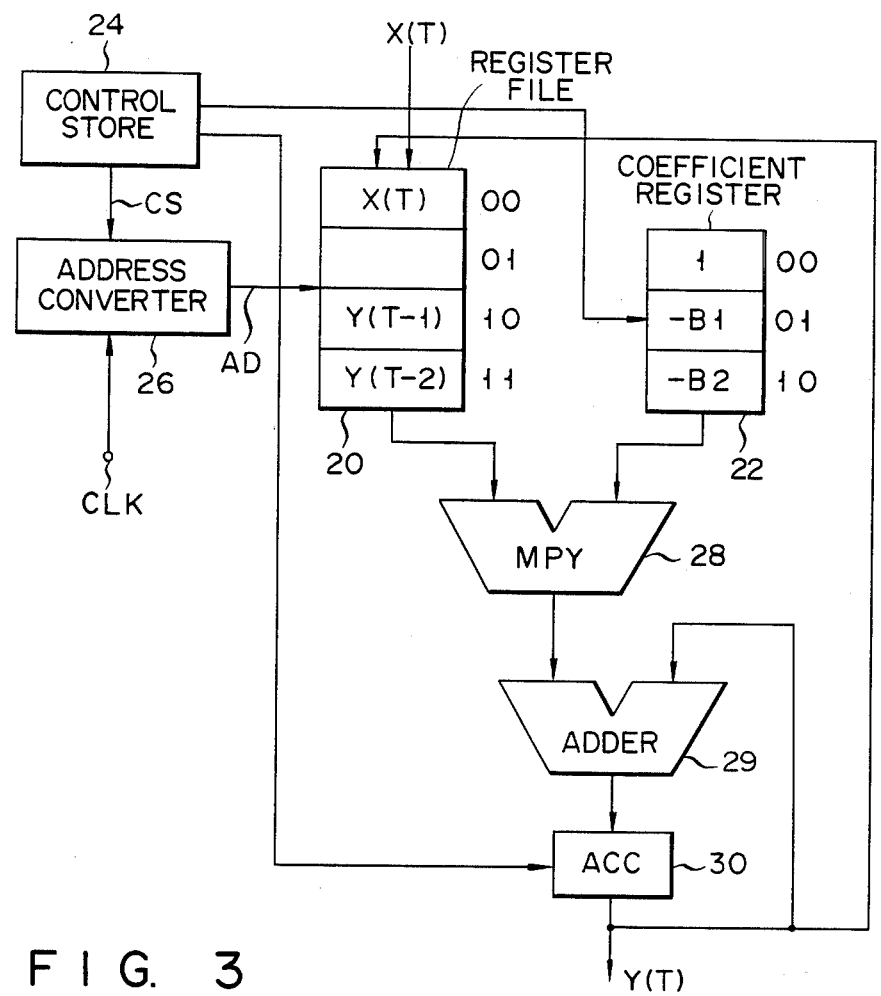
FIG. 2 is a block diagram of a second-order recursive digital filter according to the first embodiment of the present invention.

Arithmetic processing devices according to the preferred embodiments of the present invention will now be described with reference to the accompanying drawings. FIG. 2 is a block diagram of a second-order recursive digital filter defined by relation (1) above according to a first embodiment of the present invention. Variables X(T), Y(T−1) and Y(T−2) are stored in a register file 20, while coefficients +1, −B1 and −B2 are stored in a coefficient register (e.g., ROM) 22. Numerals next to each block of the register file 10 and the coefficient register 22 indicate their addresses. The coefficient register 22 is accessed by an address signal from a control store 24. The register file 20 is accessed by a second address signal AD which is obtained by converting a first address signal CS from the control store 24 by an address converter 26. Outputs from the register file 20 and the coefficient register 22 are supplied to a multiplier 28, and the multiplied product outputs from the multiplier 28 are added by an adder 29 and an accumulator 30 to provide Y(T) of relation (1) above. The accumulator 30 is cleared by the control store 24.

Figure 3:
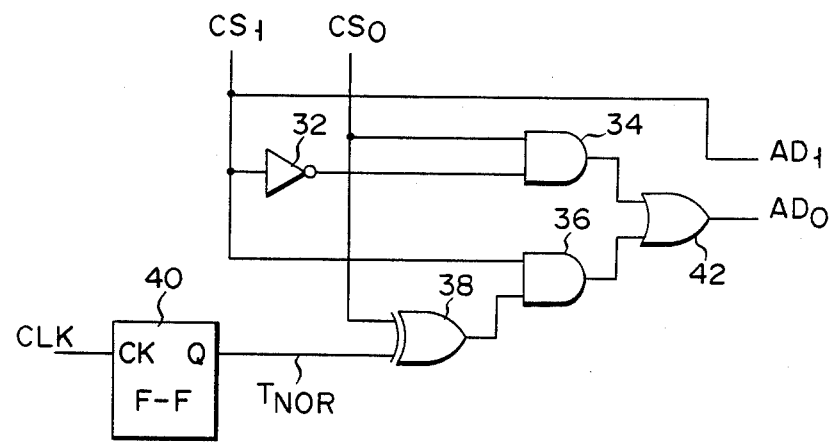
FIG. 3 is a block diagram of an address converter of the digital filter shown in FIG. 2.

FIG. 3 is a block diagram of the address converter 26. Since the register file 20 in FIG. 2 has 4 addresses, the address signal for accessing the register file 20 must be a 2-bit signal. The most and least significant bits of the 2-bit first address signal CS are represented by $CS_1$ and $CS_0$, and those of the second address signal AD are represented by $AD_1$ and $AD_0$. The most significant bit $CS_1$ of the first address signal is produced as the most significant bit $AD_1$ of the second address signal. The most significant bit $CS_1$ of the first address signal is supplied to the first input end of an AND gate 34 through an inverter 32, and is also supplied to the first input end of an AND gate 36. The least significant bit $CS_0$ of the first address signal is supplied to the second input end of the AND gate 34 as well as to the first input end of an EX-OR gate 38. A sampling clock signal CLK (one for each sampling period) for determining the sampling period is supplied to a clock input terminal CK of a flip-flop 40. An output from the flip-flop 40 is T modulo 2 where T is the current sampling period number, and is called a normalized sampling period number $T_{NOR}$. The output $T_{NOR}$ from the flip-flop 40 is supplied to the second input end of the EX-OR gate 38. An output from the EX-OR gate 38 is supplied to the second input end of the AND gate 36. Outputs from the AND gates 34 and 36 are supplied to an OR gate 42 which produces as an output the least significant bit $AD_0$ of the second address signal.

In order to explain the mode of operation of the digital filter of the first embodiment of the present invention, the mode of operation of the address converter 26 will first be described. As may be seen from FIG. 3, the second address signal AD may be represented as follows using the first address signal CS and the normalized sampling period number $T_{NOR}$:

$$AD_1 = CS_1 \quad (2)$$

$$AD_0 = \overline{CS_1} \cdot CS_0 + CS_1 \cdot (CS_0 \oplus T_{NOR}) \quad (3)$$

T, $T_{NOR}$, $CS_{0-1}$ and the second address signal $AD_{0-1}$ hold the relationships shown in Table 1 below:

TABLE 1

| | T | | | | | |
|---|---|---|---|---|---|---|
| | 0 | 1 | 2 | 3 | 4 | ... |
| | | | $T_{NOR}$ | | | |
| $CS_{0-1}$ | 0 | 1 | 0 | 1 | 0 | ... |
| 00 | 00 | 00 | 00 | 00 | 00 | ... |
| 01 | 01 | 01 | 01 | 01 | 01 | ... |
| 10 | 10 | 10 | 11 | 10 | 11 | 10 | ... |
| 11 | 11 | 11 | 10 | 11 | 10 | 11 | ... |

As may be seen from the above table, when the most significant bit $CS_1$ of the first address signal is "0", the second address signal $AD_{0-1}$ remains the same as the first address signal $CS_{0-1}$. When the least significant bit $CS_1$ of the first address signal is "1", the most significant bit $AD_1$ of the second address signal remains $CS_1$. When $T_{NOR}$ is "0", the least significant bit $AD_0$ remains the same as $CS_0$. When $T_{NOR}$ is "1", the least significant bit $AD_0$ is $\overline{CS_0}$. In this manner, only the two first address signals "10" and "11" are converted. In other words, the least significant bit $CS_0$ is converted only if the most significant bit $CS_1$ of the first address signal is "1". By substituting $CS_1 = 1$ in relation (3), relation (3) may be rewritten as:

$$AD_0 = CS_0 \oplus T_{NOR} \quad (4)$$

$$= (CS_0 - T_{NOR}) \text{ modulo } 2$$

This address conversion processing may be universally explained as follows. If the number of addresses to be accessed is N, an address signal must have m ($N \leq 2^m$) bits. Thus, we obtain:

$$\left. \begin{array}{l} AD_{0-(m-1)} = (CS_{0-(m-1)} - T \text{ modulo } N) \text{ modulo } N \\ AD_m = CS_m \end{array} \right\} \quad (5)$$

At this moment, m is 1.

In order to access 4 addresses of the register file 20, the control store 24 produces a first address signal of 2 bits. Since the second address signal is also of 2 bits, the most significant bit $AD_1$ may be $CS_1$.

Figure 4A:
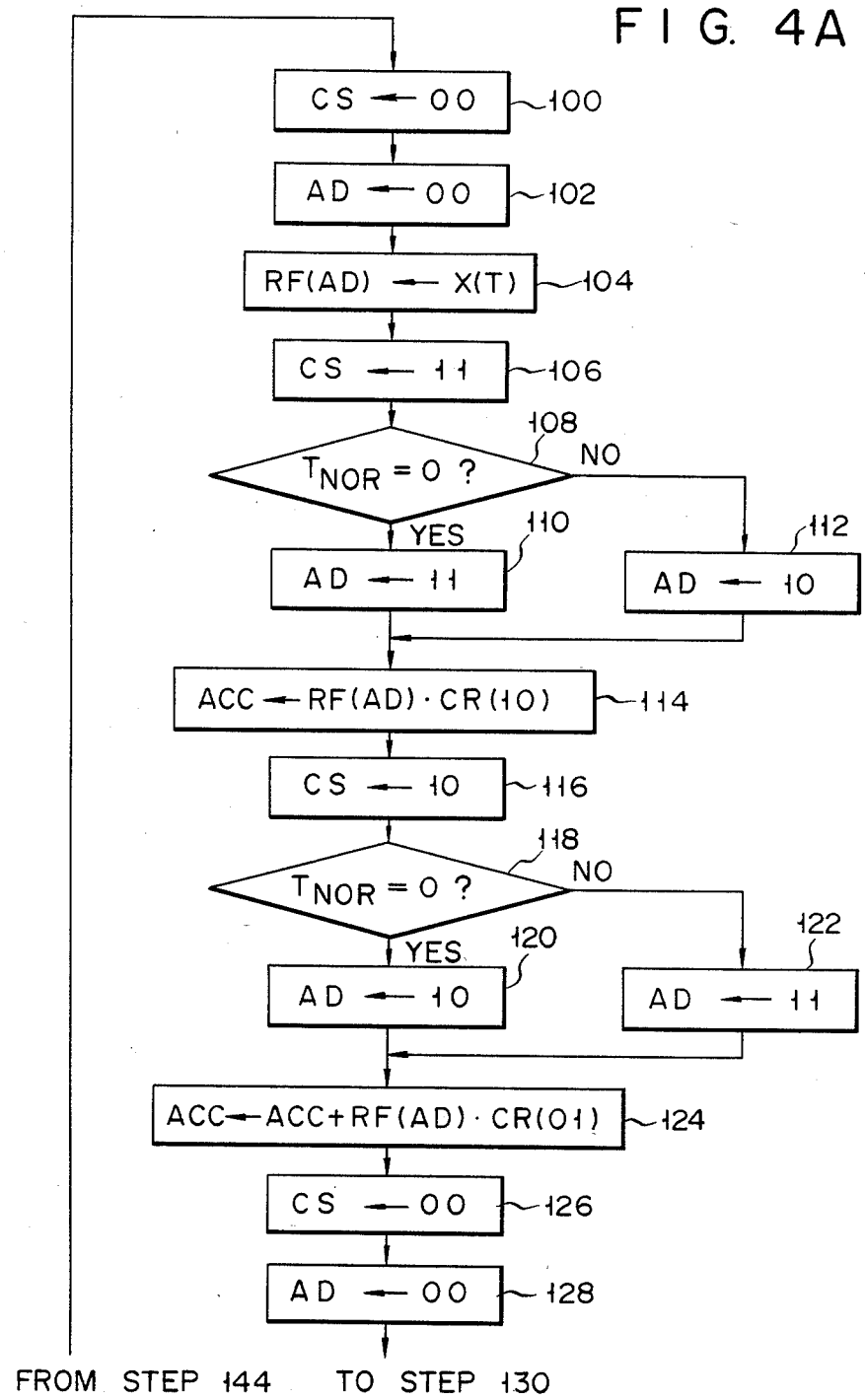
FIGS. 4A and 4B are flowcharts for explaining the mode of operation of the digital filter shown in FIG. 2.
Figure 4B:
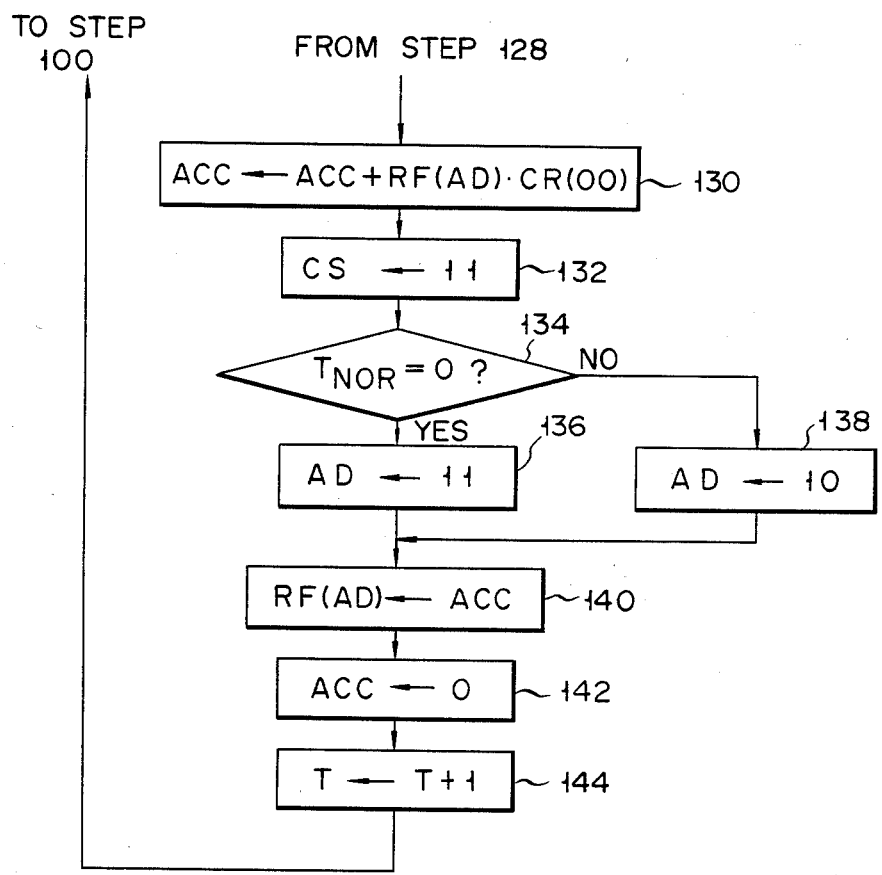

The mode of operation of the digital filter of the first embodiment of the present invention will now be described with reference to the flowcharts shown in FIGS. 4A and 4B. In step 100, a first address signal CS is set to "00". In step 102, the first address signal CS is converted to a second address signal AD. Note that since $CS_1=0$, AD=CS="00". In step 104, sample input data X(T) is stored in the AD address of the register file 20 (the address designated by the second address signal AD). In step 106, the first address signal CS is set to "11". Since the most significant bit $CS_1$ is "1", the second address signal AD is in accordance with the normalized sampling number $T_{NOR}$. In step 108, whether or not $T_{NOR}$ is "0" is discriminated. If YES in step 108, AD is set to "11" in step 110. If NO in step 108, AD is set to "10" in step 112. Assume that in the initial state Y(T−1) and Y(T−2) are stored in the addresses "10" and "11", respectively, of the register file 20, as shown in FIG. 2. In the first sampling period, that is, when T=0, $T_{NOR}$=0 and therefore AD=11. Y(T−2) is stored in the address "11" of the register file 20. In step 114, data RF(AD) at the AD address of the register file 20 is multiplied by data CR(10) at the address "10" of the coefficient register 22. The product obtained, −B2.Y(T−2) is supplied to the accumulator 30. In step 116, the first address signal CS is set to "10". In step 118, whether or not $T_{NOR}$ is "0" is discriminated. According to the discrimination result obtained in step 118, the second address signal AD is set to "10" or "11" in step 120 or 122, respectively. In step 124, the data RF(AD) at the AD address of the register file 20 is multiplied by data CR(01) at the address "01" of the coefficient register 22. The product obtained is added to the content in the accumulator 30. The content of the accumulator 30 is thus updated to −B1.Y(T−1)−B2.Y(T−2). In step 126, the first address signal CS is set to "00". In step 128, the second address signal AD is also set to "00". In step 130, the data RF(AD) of the AD address of the register file 20 is multiplied by data CR(00) at the address "00" of the coefficient register 22. The product obtained is added to the content of the accumulator 30. The content of the accumulator 30 is updated to $-X(T) - B1 \cdot Y(T-1) - B2 \cdot Y(T-2) \; (=Y(T))$. The current output data Y(T) is then stored in the register file 20. For this purpose, the control store 24 produces the same first address signal CS as that produced for accessing the output data Y(T−2). In step 132, the first address signal CS is set to "11". In step 134, it is determined whether or not $T_{NOR}$ is "0". In accordance with the discrimination result obtained in step 134, the second address signal AD is set to "11" or "10" in step 136 or 138, respectively. This is because Y(T−2) of the current sampling period is not required in the next sampling period. In step 140, the current output data Y(T) (Y(T−1) in the next sampling period) is stored in the AD address of the register file 20. In the first sampling period, that is, when T=0, since $T_{NOR}$=0, Y(T) is stored in the address "11". Thereafter, the accumulator 30 is cleared in step 142 to complete the operation for one period. In step 144, T is incremented by 1 and the flow returns to step 100.

In the second sampling period, Y(T−2) and Y(T−1) are respectively stored at the addresses "10" and "11" of the register file 20. At this time, since $T_{NOR}$ is "1", the address "10" of the register file 20 is designated as shown in step 112 for accessing Y(T−2), and the address "11" of the register file 20 is designated as shown in step 122 for accessing Y(T−1), thereby allowing correct operation. As shown in step 138, the output data Y(T) is stored at the address "10" of the register file 20, at which Y(T−2) is stored. In the third sampling period, that is, when T=2, the addresses "10" and "11" of the register file 20 need only be designated in order to access Y(T−1) and Y(T−2). This is the same operation as that required in the first sampling period. In a similar manner, in the even and odd sampling periods, the addresses for accessing Y(T−1) and Y(T−2) are alternately set to be "10" and "11". In the first embodiment of the present invention, the even and odd sampling periods are discriminated in accordance with the normalized sampling number $T_{NOR}$.

In accordance with the first embodiment of the present invention, in each sampling period, the current output data Y(T) is stored in the address of the register file which has stored the output data Y(T−2). In the next sampling period, the addresses for accessing Y(T−1) and Y(T−2) are converted from one to the other. This address conversion is performed by the address converter 26 in accordance with the output from the control store 24 for designating the same address to access the same data and the normalized sampling period number. Even if the control store 24 produces a predetermined address signal, i.e., stores a fixed microprogram, data transfer within the register file 20 is not necessary, so that the processing speed of the digital filter is improved.

Figure 5:
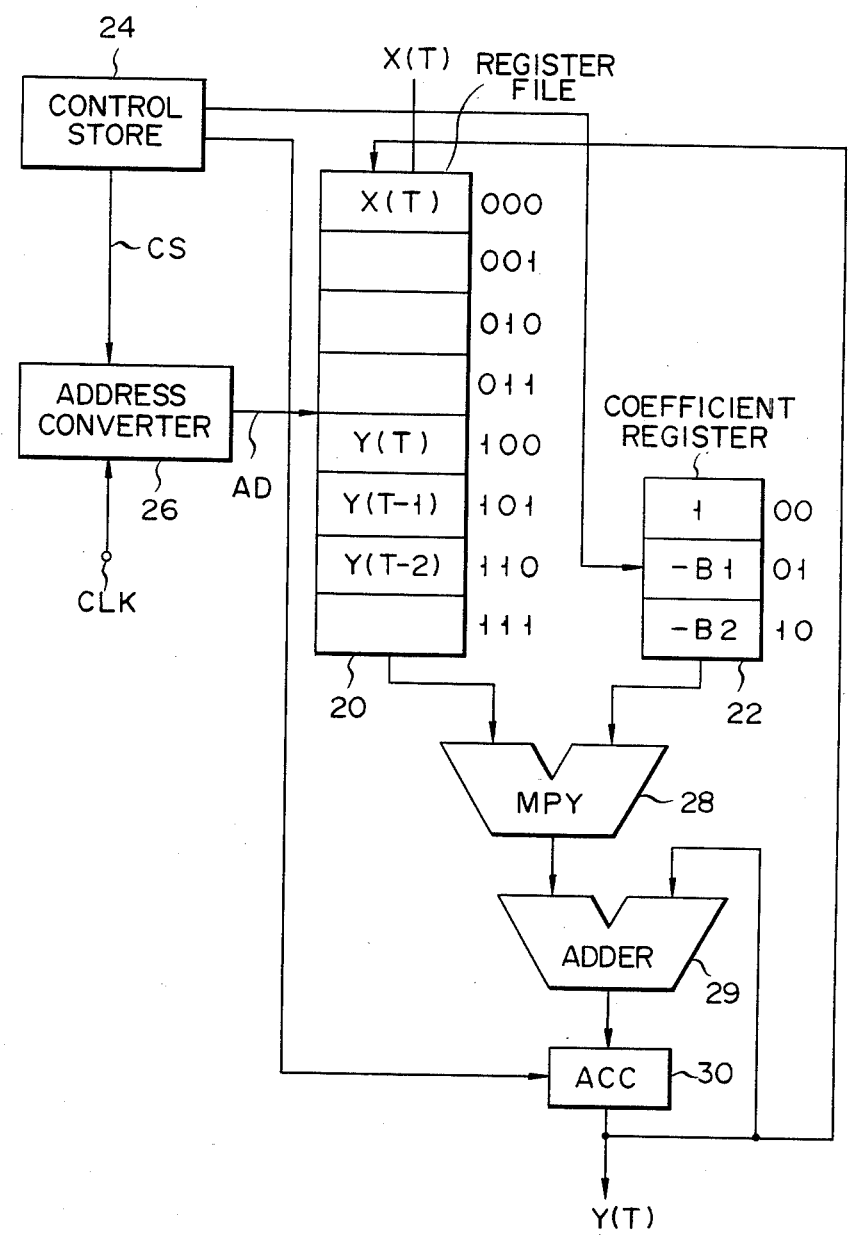
FIG. 5 is a block diagram of a second-order recursive digital filter according to the second embodiment of the present invention.
Figure 6:
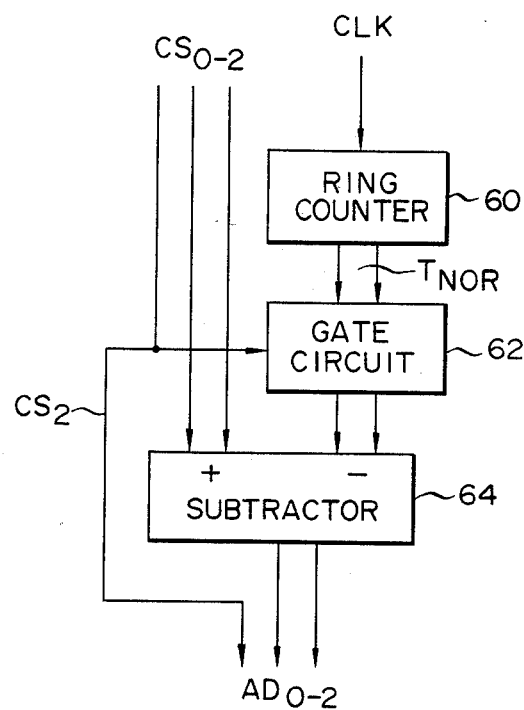
FIG. 6 is a block diagram of an address converter of the digital filter shown in FIG. 5.

A digital filter according to a second embodiment of the present invention will now be described with reference to FIG. 5. In the first embodiment, the address signal for the register file is a 2-bit signal. However, in the second embodiment to be described hereinafter, the address signal for the register file is a 3-bit signal, and output data is stored in addresses "100" to "110" of a register file 20. The digital filter of the second embodiment is also an implementation of relation (1) given above. The digital filter of the second embodiment shown in FIG. 5 differs from that of the first embodiment in the capacity of the register file 20 and in the configuration of an address converter 26. The register file 20 has $2^3$=8 addresses; input data X(T) is stored in the address "000" and, at an initial state, output data Y(T), Y(T−1) and Y(T−2) is stored in the addresses "100" to "110". The address converter 26 has the configuration as shown in FIG. 6. A sampling clock signal CLK is supplied to a ring counter 60. The ring counter 60 is a 2-bit counter and its output is T modulo 4 (where T is the current sampling period number). In other words, the output from the ring counter 60 is the normalized sampling signal $T_{NOR}$ of 2 bits, and is supplied to the input end of a gate circuit 62. Since the address signal for the register file 20 is a 3-bit signal, the control store 24 produces a first address signal $CS_{0-2}$ of 3 bits. The MSB, i.e., the third bit $CS_2$ of the first address signal is supplied to the control end of the gate circuit 62. The gate circuit 62 allows passage of an input signal therethrough when the control end thereof is at logic level "1", and prohibits it, i.e., produces output signals "0" and "0", when the control end thereof is at logic level "0". The second and first bits of the first address signal are supplied to the positive input end of a subtractor 64, and an outputs from the gate circuit 62 are supplied to the negative input end thereof. The third bit $CS_2$ of the first address signal becomes the third bit $AD_2$ of the second address signal, and an output signals from the subtractor 64 becomes the second and first bits $AD_1$, $AD_0$ of the second address signal.

The mode of operation of the digital filter according to the second embodiment of the present invention will now be described. First, the relationship between T, $T_{NOR}$, $CS_{0-2}$ and $AD_{0-2}$ in the address converter 26 will be described.

TABLE 2

| | T | | | | | |
|---|---|---|---|---|---|---|
| | 0 | 1 | 2 | 3 | 4 | ... |
| | $T_{NOR}$ | | | | | |
| $CS_{0-2}$ | 00 | 01 | 10 | 11 | 00 | ... |
| 000 | 000 | 000 | 000 | 000 | 000 | ... |
| 001 | 001 | 001 | 001 | 001 | 001 | ... |
| 010 | 010 | 010 | 010 | 010 | 010 | ... |
| 011 | 011 | 011 | 011 | 011 | 011 | ... |
| 100 | 100 | 111 | 110 | 101 | 100 | ... |
| 101 | 101 | 100 | 111 | 110 | 101 | ... |
| 110 | 110 | 101 | 100 | 111 | 110 | ... |
| 111 | 111 | 110 | 101 | 100 | 111 | ... |

The address conversion is performed only when the most significant bit $CS_2$ of the first address signal is "1", as in the case of the first embodiment. Therefore, the number of addresses which must be subjected to address conversion is $4=2^2$ where m=2. In other words, the address conversion processing of the second embodiment may be expressed by the following equations obtained by substituting m=2 in relation (5) above:

$AD_{0-1} = (CS_{0-1} - T \text{ modulo } 4) \text{ modulo } 4$ $AD_2 = CS_2$

In this manner, in the address converter 26 of the second embodiment, the first address signal is periodically converted to the second address signal designating the adjacent address.

The mode of operation of the overall filter of the second embodiment of the present invention will now be described. When the input data X(T) is to be accessed, the control store 24 produces a first address signal "000". On the other hand, when the output data Y(T), Y(T−1) and Y(T−2) must be accessed, the control store 24 produces first address signals "100", "101" and "110", respectively. A first address signal having the MSB "0" is directly handled as the second address signal. In this manner, the input data X(T) is constantly stored in the address "000" of the register file 20. When the MSB of the first address signal is "1", the less-two bits $CS_{0-1}$ of the first address signal are converted to the less-two bits $AD_{0-1}$ of the second address signal. As shown in FIG. 5, in the first sampling period, the input data X(T), the current output data Y(T) (which is not actually stored until the operation is completed), the immediately preceding output data Y(T−1) and the output data Y(T−2) which immediately precedes the output data Y(T−2) are stored at the addresses "000", "100", "101"and "110" of the register file 20, respectively. Since $T_{NOR}$="00", the first address signal is directly used as the second address signal. The control store 24 can correctly access the data to be used for operation processing in accordance with relation (1). In the next sampling period, each piece of output data is considered as the immediately preceding data with respect to time. More specifically, the pieces of data which have been stored at the addresses "100", "101", and "110" respectively become Y(T−1), Y(T−2) and Y(T−3) in the next sampling period. Thus, the greater the address of the register file 20, the further ahead in time is the data which is stored therein. For this reason, as the sampling period number increases, the address for accessing the same data is sequentially decremented. According to Table 2, the first address signals are converted to the second address signals such that the addresses are sequentially decremented. Accordingly, the control store 24 can correctly access the previous output data Y(T−1) and Y(T−2) in the second sampling period where $T_{NOR}$="01". In a similar manner, the second address signals are decremented in the order of "101", "100", "111", "110", "101" and so on for accessing the immediately preceding output data Y(T−1) and are decremented in the order of "110", "101", "100", "111", "110" and so on for accessing the preceding output data Y(T−2).

According to the second embodiment of the present invention, the output address signals from the control store 24 for accessing the previous output data are suitably converted by the address converter 26 so that appropriate data may be continuously accessed. Data transfer within the register file 20 need not be performed, so that a high-speed digital filter may be realized.

In the two embodiments described above, half of the first address signals are converted and the remainder of the signals are used as the second signals without modification with respect to the MSB of the first address signal. However, this is for inputting each input data and does not present any problem.

The present invention is not limited to the particular embodiments described above, and various other changes and modifications may be made within the spirit and scope of the present invention. For example, the address converter comprises discrete elements. However, the address converter may comprise a ROM which receives, as an address signal, a first address signal and a normalized sampling signal, and which then produces a second address signal. In the first embodiment, the ROM may have 8 addresses for $T_{NOR}$="0", "1" in Table 1. In the second embodiment, the ROM may have 16 addresses for $T_{NOR}$="00", "01", "10", and "11" in Table 2. The address signal for the register file may have any number of bits. In this case, the address conversion may be performed for all the addresses or for half the number of addresses as in the embodiments described above. The algorithm of this address conversion is represented by relation (5). Although the above description has been made with reference to a second-order recursive digital filter, the present invention may be applied to a third- or higher-order recursive digital filter or to a non-recursive digital filter. The present invention is not limited to a digital filter for processing previous sampling signals with respect to time but to a circuit for processing previous sampling signals with respect to space.

What is claimed is:

1. An arithmetic processing device for calculating output data during each sampling period using the input data during the sampling period and the output data during a few preceding sampling periods, comprising:

register means having N addresses (where N is a positive integer) for storing the output data during a pluality of preceding sampling periods and the input data during the sampling period;

a control store for producing a first address signal CS of m bits (where N is $\leq 2^m$) corresponding to data to be read out;

address converting means, coupled to the control store and the register means, for converting the first address signal into a second address signal according to a current sampling period number T (=0, 1, 2, ...), at least one bit of the second address signal AD being=(the corresponding at least one bit of CS - T modulo N) modulo N; and, arithmetic processing means, coupled to the register means and to the control store, for reading the data from the register means with the second address signal and for performing predetermined operations for read out data.

2. An arithmetic processing device according to claim 1, in which said register means has two addresses; said control store produces the first address signal CS of 2 bits; and said address converting means has a flip-flop for receiving a sampling signal synchronous with the sampling period, an EX-OR gate for receiving an output from said flip-flop and a least significant bit $CS_0$ of the first address signal, a first AND gate for receiving an inverted signal of the most significant bit $CS_1$ of the first address signal and a least significant bit $CS_0$ of the first address signal, a second AND gate for receiving the most significant bit $CS_1$ of the first address signal and an output from said EX-OR gate, and an OR gate for receiving outputs from said first and second AND gates, said address converting means producing the most significant bit $CS_1$ of the first address signal and an output from said OR gate as a most significant bit $AD_1$ and a least significant bit $AD_0$ of the second address signal, respectively.

3. An arithmetic processing device according to claim 1, in which said register means has 4 addresses; said control store produces the first address signal CS of 3 bits; and said address converting means has a 2-bit ring counter for receiving a sampling signal synchronous with the sampling period, a gate circuit which is conductive in accordance with a most significant bit $CS_2$ of the first address signal and selectively allows passage of an output from said ring counter therethrough, and a subtractor for subtracting an output from said gate circuit from two less significant bits $CS_1$, $CS_0$ of the first address signal, said address converting means producing the most significant bit $CS_2$ of the first address signal and an output from said subtractor as a most significant bit $AD_2$ and two less significant bits $AD_1$, $AD_0$ of the second address signal, respectively.

4. An arithmetic processing device according to claim 1, in which said address converting means comprises a read-only memory having an address signal comprising the first address signal and a T modulo N signal.

5. An arithmetic processing device according to claim 1, in which said arithmetic processing means comprises a coefficient register which stores coefficients and which is accessed by said control store, a multiplier for multiplying an output from said register means and an output from said coefficient register, and a summing circuit for summing outputs from said multiplier, an output from said summing circuit being produced as current output data and being stored in said register means.

6. A digital for calculating output data during each sampling period using the input data during the sampling period and the output data during a plurality of preceding sampling periods, comprising:

register means having N addresses (where N is a positive integer) for storing the output data during a pluality of preceding sampling periods and the input data during the sampling period;

a control store for producing a first address signal CS of m bits (where $N \leq$ than $2^m$) corresponding to data to be read out;

address converting means, coupled to the control store and the register means, for converting the first address signal into a second address signal according to a current sampling period number T (=0, 1, 2,...), at least one bit of the second address signal AD being=(the corresponding at least one bit of CS - T modulo N) modulo N, and any other bits of said second address signal AD being equal to corresponding bits of said first address signal CS; and, arithmetic processing means, coupled to the register means and to control store, for reading the data from the register means with the second signal, for multiplying read out data by constants and for adding multiplied data to each other.

* * * * *